United States Patent [19]

Schlangenotto et al.

[11] Patent Number: 4,918,509
[45] Date of Patent: Apr. 17, 1990

[54] GATE TURN-OFF THYRISTOR

[75] Inventors: Heinrich Schlangenotto, Neu-Isenburg; Wolf-Dieter Nowak, Frankfurt; Hermann Berg, Eppstein, all of Fed. Rep. of Germany

[73] Assignee: Licentia Patent-Verwaltungs-GmbH, Frankfurt am Main, Fed. Rep. of Germany

[21] Appl. No.: 384,111

[22] Filed: Jul. 21, 1989

Related U.S. Application Data

[63] Continuation of Ser. No. 36,382, Apr. 9, 1987, abandoned.

[30] Foreign Application Priority Data

Apr. 12, 1986 [DE] Fed. Rep. of Germany ........ 3612367
Apr. 12, 1986 [DE] Fed. Rep. of Germany ... 8609997[U]

[51] Int. Cl.$^4$ ............................................. H01L 29/74
[52] U.S. Cl. ......................................... 357/38; 357/20; 357/86; 357/89
[58] Field of Search .................. 357/38, 38 G, 86, 89, 357/20, 43

[56] References Cited

U.S. PATENT DOCUMENTS 4,691,223  9/1987  Murakami et al. .................. 357/38

FOREIGN PATENT DOCUMENTS 0066721  12/1982  European Pat. Off. .
0009367   2/1985  European Pat. Off. .
0154082   9/1985  European Pat. Off. .
2538042   3/1976  Fed. Rep. of Germany .
7527329   9/1975  France .
53-16584  2/1978  Japan ............................. 357/38 G
57-1257   1/1982  Japan ............................. 357/38 G
57-178369 11/1982 Japan .
59-132665 1/1983  Japan .

OTHER PUBLICATIONS

Patent Abstracts of Japan, vol. 7, No. 21 (E-155) [1166], Jan. 27th, 1983.
Patent Abstracts of Japan, vol. 8, No. 261 (E-281) [1698], Nov. 30th, 1984.
E. D. Wolley, "Gate Turn-Off in p-n-p-n Devices", *IEEE Transactions on Electron Devices*, vol. ed.-13, No. 7, Jul., 1966, pp. 590-597.

*Primary Examiner*—Joseph E. Clawson, Jr.
*Attorney, Agent, or Firm*—Spencer & Frank

[57] ABSTRACT

The invention relates to a gate turn-off thyristor which includes, per unit cell, a cathode-side emitter strip and two anode-side spaced emitter strips which overlap in position with the edge of the cathode-side emitter strip. In such a GTO thyristor, the maximum disconnectable anode current greatly decreases during turn-off with increasing voltage rise rate, since the electrical fields developing in the non-regenerative transistor region centered underneath the cathode-side emitter strip are too high. Reduction of the field intensity occurring in the non-regenerative transistor region and thus reduction in the decrease of the maximum disconnectable anode current is realized, according to the invention, in that a p-type zone is disposed between the two anode-side emitter strips to dynamically limit the electrical field, with this p-type zone injecting holes to a lesser degree than the adjacent emitter strips and essentially only during turn-off of high currents.

24 Claims, 4 Drawing Sheets

GATE TURN-OFF THYRISTOR

This application is a continuation, of application Ser. No. 036,382, filed Apr. 9, 1987 now abandoned.

BACKGROUND OF THE INVENTION

The present invention relates to a thyristor which can be turned off by a negative gate current (gate time-off or GTO-thyristor) having an npnp structure including a cathode side n-type emitter zone, a p-type control base zone, an n-type main base zone which, at least in partial regions, changes toward the anode side into a higher doped n+-type partial zone, and an anode side p-type emitter zone, and wherein the cathode side n-type emitter zone and the anode side p-type emitter zone are each divided into a plurality of emitter strips, with each cathode side emitter strip being opposed by two anode-side emitter strips which are positioned so as to overlap the respective edges of the respective cathode-side emitter strip.

It is known that the turn-off of a GTO-thyristor by a negative control gate current causes the current to be concentrated underneath the center of the emitter strip on the cathode side (IEEE Trans. Electron. Devices ED-13, July 1966, page 590).

This current constriction during thyristor turn-off can be counteracted in that the p-type emitter zone at the anode side interrupted by the main n-type base zone in strip-shaped regions centered underneath the associated n-type emitter strips on the cathode side and the n-type main base zone is there short-circuited with the p-type emitter zone, as shown, for example in Federal Republic of Germany DE-OS No. 2,538,042. With such anode shorting, it is additionally possible to suitably set the effective current gain factor $\alpha_{pnp}$ of the partial transistor on the anode side and thus set the turn-off characteristics without having to dope with recombination centers.

FIG. 1 shows the prior art configuration of a unit cell or element of such a GTO thyristor, with the cell being composed of a semiconductor body having an n+-type emitter strip 1 at the cathode side, a p-type control base zone 2, an n-type main base zone 3 including a highly doped n+-type partial zone 3a adjacent the surface plane or major surface of the semiconductor body at the anode side, and two spaced p+-type emitter strips 4 at the anode side, which are disposed beneath and overlap the respective edges of the emitter strip 1. The p-type control base zone 2 is in part brought to the surface plane of n+-type emitter strip 1 i.e., the cathode side major surface of the semiconductor body. Between n+-type emitter strip 1 and p-type control base zone 2 there is an n+p junction J₁ whose ends extend to the cathode side surface, between the p-type control base zone 2 and the n-type main base zone 3 there is a pn junction J₂ and between the n-type main base zone 3 and the p+-type emitter strips 4 there is an np+ junction J₃ whose ends extend to the anode side major surface of the semiconductor body. The surface of the n+-type emitter strip 1 is provided with a metal contacting layer 5 (cathode K) and with a current input terminal 6, and the exposed surface of p-type control base zone 2 is provided with a metal contacting layer 7 (gate G) and a control terminal 8. Finally, the anode side surface is provided with a metal contacting layer 9 (anode A) and a current input terminal 10, with the layer 9 contacting both the surface of the p+-type emitter strips 4 and the partial zone 3a of the n-type main base zone 3 extending to the anode-side surface.

It should be noted that the actual GTO thyristor has a plurality of unit GTO cells or elements as shown in FIG. 1 provided in the semiconductor body with a common control base zone 2 and a common main base zone 3. The current carrying capacity of the GTO thyristor is determined by the number of unit GTO cells provided.

In the unit cell of FIG. 1, a non-regenerative n+pnn+ transistor structure I is centered below the n+- type emitter strip 1. This transistor structure I functions to prevent undue concentration of the anode current into this portion of the cell when the thyristor is turned off. To realize, as a result of the shorting of the anode side emitter 4, a suitable setting of the effective current gain factor $\alpha_{pnp}$ of the partial transistor formed by zones 4, 3, 2, and thus of the turn-off characteristics, without doping with recombination centers, the anode-side p+-type emitter strips 4 must have a width which is less than the customary spacing between the cathode-side n+-type emitter strips 1 so that p+-type emitter 4 is also cut out in the center region underneath gate G. If the blocking, firing and turn-on characteristics are set to be comparable to GTO thyristors doped with recombination centers, GTO thyristors with anode shorting have smaller turn-off losses. A limitation for the maximum A limitation for the maximum turn-off anode current results from the fact that the transverse voltage drop in p-type control base zone 2 from the center of n+-type emitter strip 1 to the edge is at most equal to the breakdown voltage $U_{Br}$ of the n+p junction J₁ between p-type control base zone 2 and n+-type emitter strip 1. Accordingly, the following condition applies:

$$J_{TCM}/L = {}^*G_{off}U_{Br}/(\rho_s b) \tag{1}$$

where $\rho_s$ is the sheet resistance of the p-type control base zone 2 underneath the n+-type emitter strip 1, b is the width of the n+-type emitter strip 1, $G_{off}=J_A/J_G$ is the turn-off gain, and L is the gate and emitter edge length. If the vertical current density is homogeneous, the factor * equals 4, but drops in the limiting case of extreme current constriction during turn-off to a value of 2.

It has now been found that GTO thyristors are generally destroyed already when significantly smaller currents are turned off than calculated according to condition (1). Additionally, the anode current which can be turned off without destruction greatly decreases with increasing voltage rise rate dU/dt during turn-off, which is not expressed in condition (1). The voltage rise rate is greater, the smaller the capacitance of the capacitor of the usually employed turn-off relief circuit (snubber capacitor). This is applicable, in particular, for the GTO thyristor of FIG. 1 which employs the above-mentioned measure for reducing current constriction.

It has also been found that in the GTO thyristor of FIG. 1 the maximum turn-off anode current during turn-off against high voltages and at high dU/dt is reduced because the electrical field occurring in the non-regenerative transistor region I, indicated in dashed lines, of the GTO thyristor are too high. These high fields are generated because, with the voltage already increased, the current density j in this transistor region I is still very high, for example 10,000 A/cm², since current concentration is not completely eliminated even by shorting of the anode side. In the anode-side portion of the n-type main base zone 3 below the n+-type emitter strip 1, the current is conducted, almost exclusively by electrons. Thus the electron concentration is relatively high there, according to the following relationship:

$$n \geq j_n/(qv_n) \quad (2)$$

where q is the elementary charge and $v_n$ the saturation velocity of the electrons. Already at $j=1,000$ A/cm$^2$, n is thus at least $6 \cdot 10^{14}$/cm$^3$. Since the electron charge is compensated neither by the donor doping concentration $N_{D+}$, which is, for example, $7 \cdot 10^{13}$/cm$^3$, nor by holes, the electron current results in a high negative space charge. According to the Poisson equation $$dE/dx = \rho/\gamma\gamma_o \quad (3)$$

this results in a rise of electrical field intensity toward anode A, in contrast to the stationary case reached after turn-off. As can be seen from FIG. 1, space charge zone R in non-regenerative transistor region I is therefore located in the vicinity of the n+n junction between anodeside n+-type zone 3a and n-type base zone 3, while in the adjacent regions, as after turn-off in general, it is located in the vicinity of pn-junction J$_2$ because these regions carry only little current now and additionally in part have a four-layer structure.

Since, at high currents, the negative space charge is significantly greater than the positive space charge in the stationary case $$-\rho_{dyn} = qn >> qN_D+ = \rho_{stat},$$

the negative field intensity gradient and thus the maximum value of the field intensity at a given voltage is substantially greater than in the stationary case. Thus, the critical field intensity $E_{cr}$ leading to an avalanche breakthrough is reached during turn-off already at relatively low voltages. In a GTO thyristor according to FIG. 1, this results in a limitation of the turn-off current and of the voltage rise rate dU/dt during turn-off. A reduction of the mutual spacing between p+-type emitter strips 4 results in partial compensation of the negative space charge by holes in the center region and thus to a reduction of excess field intensity. However, the current constriction in this region then becomes greater again. In particular, another advantage is lost during turn-off; namely that of a position of the anode-side p+-type emitter strips 4 shifted greatly toward the gate G. This advantage resides in the fact that the injection of holes through the p+-type emitter strips 4 when a negative control current is applied is prevented more quickly. In the short-circuited diode structure composed of p+-type emitter strips 4, n-type main base zone 3, n+-type partial zone 3a and anode contact 9, a short-circuit current then flows in the reverse direction through p+-type emitter 4 and contact 9 to n+-type partial zone 3a. This current component, which makes no contribution to the external anode tail current, instead contributes to the removal of the charge carriers, i.e. accelerates the turn-off process.

European Patent Application EP-OS No. 0,066,721, published Dec. 15, 1982 teaches increasing the permissible dU/dt value during turn-off, i.e. reducing the required RCD snubber circuit, without the maximum turn-off current and the sustaining voltage against which the turn-off can be made having to be reduced. To accomplish this, the thickness of the n-type main base zone is increased in the prior art GTO thyristor. However, a significant increase in the thickness of the n-type main base zone has the drawback that the tail current and the tail time, and thus the switching losses, are much higher compared to a GTO thyristor operated with a snubber.

SUMMARY OF THE INVENTION

It is an object of the present invention to provide a gate turn-off thyristor of the type discussed above in which the decrease of the maximum turn-off current with increasing voltage rise rate, i.e. with decreasing capacitance of the snubber capacitor, is reduced and, in the absence of a snubber circuit, the maximum turn-off current and the voltage against which a turn-off can be made are increased without having to give the n-type main base zone a greater thickness.

The above object is generally achieved according to the present invention in that in a GTO-thyristor having an npnp structure formed in a semiconductor body and having a cathode side n-type emitter zone which is divided into a plurality of emitter strips, with each n-type emitter strip being opposed by a pair of anode-side p-type emitter strips which are positioned so as to overlap the respective edges of the respective cathode-side emitter strip, and further having a p-type control base zone and an n-type main base zone disposed between the cathode side and anode side emitter stips, with the n-type main base zone, at least in partial regions, changing toward said anode side into a higher doped n+-type partial zone; a field limiting p-type zone is disposed between each pair of the anode side emitter strips which are positioned opposite a respective cathode side emitter strip in a region of the n+-type partial zone so as to dynamically limit the electrical field, with the field limiting p-type zone injecting holes to a lesser degree than the adjacent pair of anode side emitter strips and essentially only during the turn-off of high currents.

The invention realizes a number of advantages. Initially, the maximum turn-off current decreases considerably less with increasing voltage rise rate dU/dt, and with a given turn-off current, the permissible voltage rise rate during turn-off is increased, thus enabling the snubber circuit, to which the current is commutated when the GTO thyristor is turned off and which determines the voltage rise rate, to be equipped with a smaller capacitor. The result is that turn-off losses as well as turn-on losses for the switch (including losses in the snubber) are reduced, resulting in a raised frequency limit which is determined essentially by the switching losses and thus the amount of heat to be dissipated. It is of particular significance for use of the present invention that, even completely without a snubber circuit, relatively high currents can be switched off against relatively high voltages. A further advantage is that the two anode-side p+-type emitter strips can now be placed at a grater distance from one another without thus reducing the maximum turn-off current due to the abovementioned effect of increased field intensity. Such a shift of these p+-type emitter strips toward gate G interrupts the injection of the p+-type emitter zone more quickly during turn-off, resulting in a reduction of the tail time and of switching losses, as well as of the extracted charge in the gate circuit.

The present invention will now be described in greater detail with reference to an embodiment which is illustrated schematically in the drawing figures.

DETAILED DESCRIPTION OF THE PREFERRED EMBODIMENTS

Figure 1:
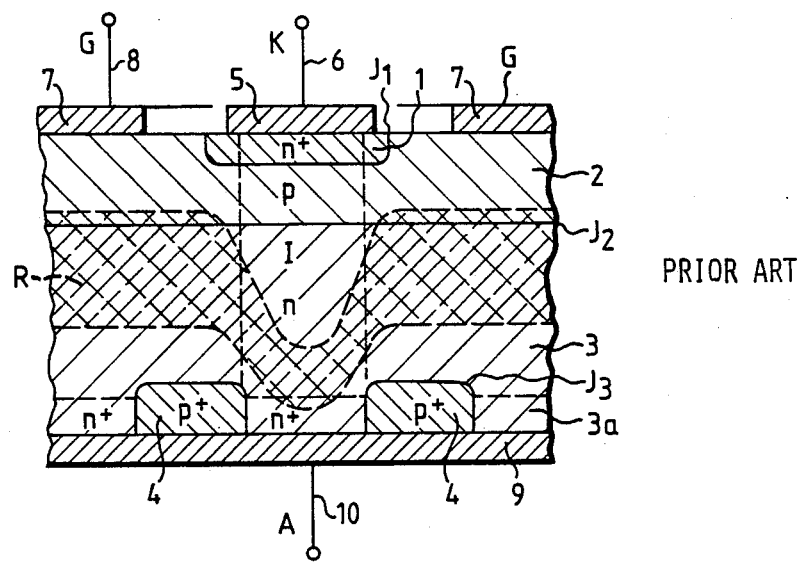
FIG. 1 shows a unit cell in a known gate turn-off thyristor and the course of the space charge zone during turn-off.
Figure 2:
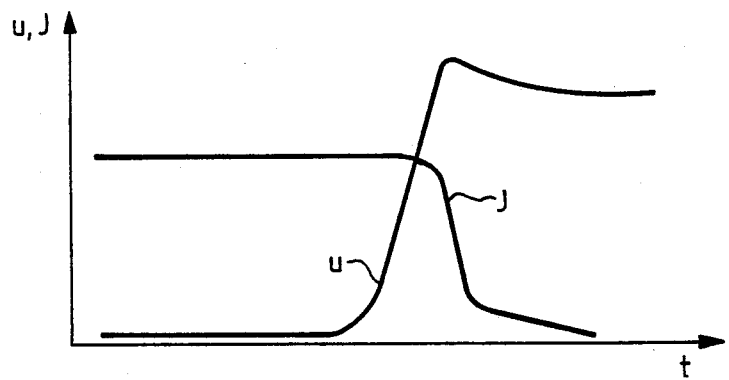
FIG. 2 shows the current (J) and voltage (U) curves for a GTO thyristor without a snubber when an inductive load is turned off.

The switching off of high currents against high voltages in the thyristor according to FIG. 1 operating under an inductive load and without parallel capacitor results in the current and voltage curves shown in FIG. 2. As can be seen, the current J drops extensively only after voltage u has reached the full external voltage value. Thus, the voltage across the component reaches it maximum value with almost the full load current.

Figure 3:
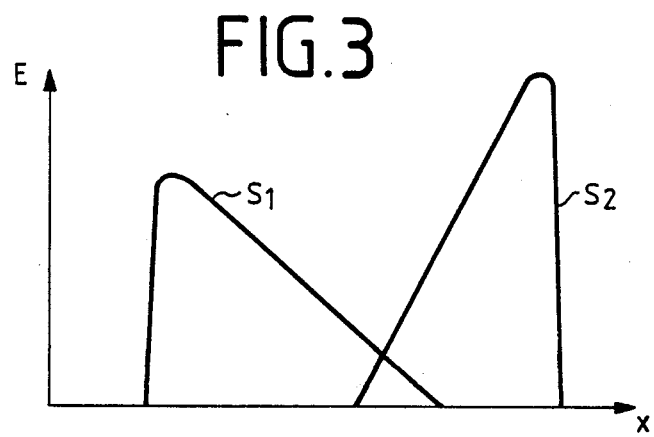
FIG. 3 shows the field intensity distribution in a thyristor according to FIG. 1.
Figure 3:
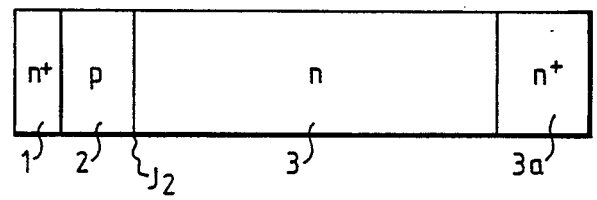

As can be seen from curve S1 of FIG. 3, with the GTO thyristor turned off, the field intensity E takes on its maximum value at pn-junction $J_2$. However, during turn-off of high currents, the field intensity E has its maximum value, as shown by curve S2, at the $nn^+$ junction of non-regenerative transistor region I because of the free electrons, and this maximum value is significantly higher at high currents than the maximum field intensity after turn-off.

Figure 4:
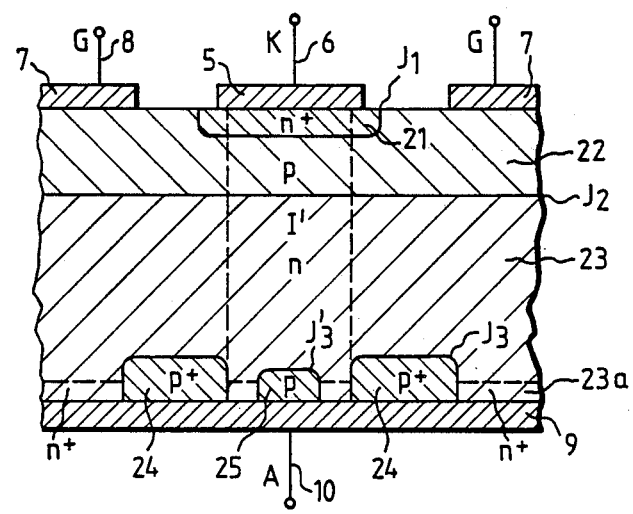
FIG. 4 shows an embodiment of the unit cell of a gate turn-off thyristor according to the invention.

The unit GTO cell according to one embodiment of the invention shown in FIG. 4, like the unit cell according to FIG. 1, has an $n^+$-type emitter strip 21, a p-type control base zone 22, an n-type main base zone 23 having a highly doped $n^+$-type partial zone 23a and two anode-side $p^+$-type emitter strips 24 which are spaced from each other and disposed so that they overlap the respective edges of the $n^+$-type cathode side emitter zone 21.

Between the anode-side $p^+$ emitter strips 24 at the anode-side surface of the semiconductor body there is now disposed a p-type zone 25 for dynamically limiting the electrical field. As shown, zone 25 extends from the anode-side surface through the $n^+$-type partial zone 23a to form a pn-junction $J'_3$ which extends to the anode-side surface of the semiconductor body where it is short-lived by the contact layer 9. This zone 25 likewise injects holes but to a lesser extent and essentially only during turn-off of high currents. The width of this additional p-type zone 25 is essentially less than that of the two outer $p^+$-type emitter strips 24. Because the pn-junction $J'_3$ at the edge of p-type zone 25 is shorted by contacting layer 9, the injection capability is thus smaller as well. The emitter efficiency is reduced here by stetting the width of p-type zone 25 so that it is impossible to switch on the four-zone region without lateral feeding, i.e.

$$\alpha_{pnp}+\alpha_{npn}<1,$$

so that not much current flows there during the forward conduction phase. Region I' between the two $p^+$-type emitter strips 24 above p-type zone 25 must thus not be regenerative, similar to the region I of thyristor of FIG. 1.

If turn-off occurs under the conditions described in connection with FIG. 2, the electrons which partially compensate the space charge of donors $N_D+$ cause the space charge zone in the n-type main base zone 23 to be pushed so close to center p-type zone 25 that the latter now injects holes. The distance between the space charge zone and p-type zone 25 decreases until the injection of holes by p-type zone 25 no longer permits a further reduction of the space charge and expansion of the space charge zone. In contrast to the prior art GTO thyristor of FIG. 1, the space charge R does not become negative but only less positive than for stationary forward blocking loads.

Figure 5:
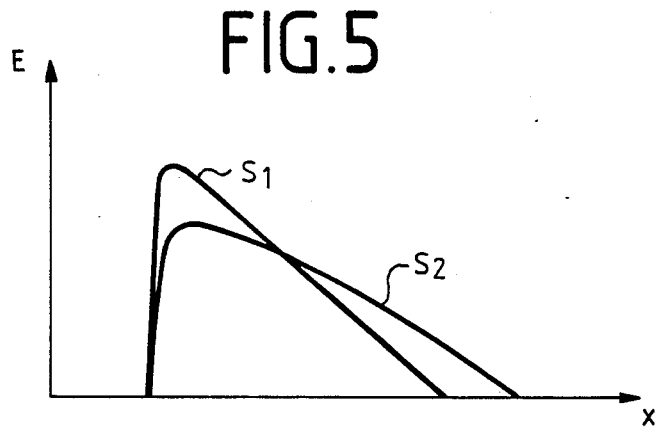
FIG. 5 shows the field intensity distribution in a thyristor according to FIG. 4.
Figure 5:
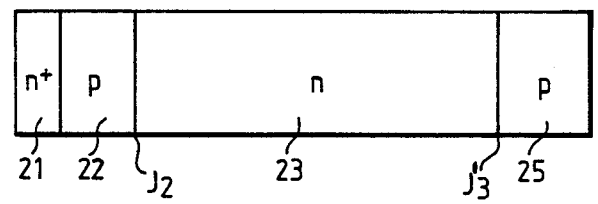

As evident from curve S2 of FIG. 5, in the GTO thyristor of FIG. 4, the field intensity E increases less strongly from the anode side to the center pn junction $J_2$ than in the stationary case (S1). Therefore, the space charge zone in region I' has a greater expanse than in the adjacent regions. In contrast to the prior art thyristor of FIG. 1, however, it forms continuously around pn junction $J_2$. The injection capability of field limiting p-type zone 25 can be determined not only by its width but also by the doping concentration profile. If the doping concentration is selected to be less than for $p^+$-type emitter strips 24, one need only slightly reduce the width of p-type zone 25 to set the emitter efficiency. This has advantages for the manufacturing process and the hole injection during current constriction at turn-off is not limited to too small an area. The width of p-type zone 25 is advisably selected to be between 50 and 100 μm.

Figure 6:
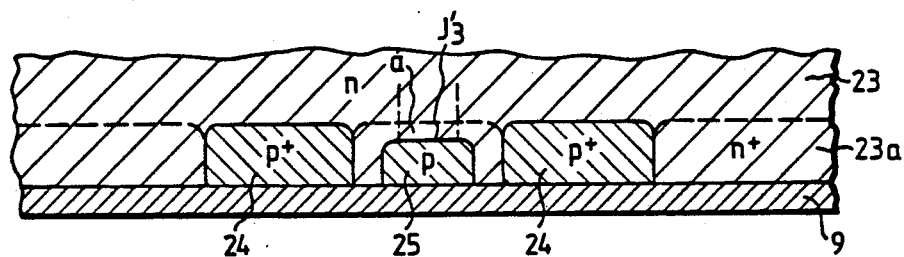
FIG. 6 shows the anode side of another embodiment of the unit cell of a gate turn-off thyristor according to the invention.

Another possibility for reducing the effective emitter efficiency of p-type zone 25 is to increase the doping concentration of n-type base zone 23 in the region in front of p-type zone 25. As shown in FIG. 6, the maximum doping concentration $N'_{max}$ can easily be selected to be higher in a region of n-type base zone 23 in front of p-type zone 25 than in front of $p^+$-type emitter strips 24 in that partial zones 23a of n-type base zone 23 and p-type zone 25 are produced by diffusion, and the thickness of p-type zone 25 is set to be less than the thickness of $n^+$-type partial zone 23a. Due to the higher maximum doping concentration $N'_{max}$, the drop in transverse voltage produced in n-type base zone 23 by the electron current flowing laterally to the shorted regions becomes less and hence the pn-junction $J'_3$ between p-type zone 25 and n-type base zone 23 has a smaller forward bias. The result is that the starting current density $j_{om}$ required in center region I' above p-type zone 25 to cause p-type zone 25 to begin injecting is greater, with otherwise identical dimensions, than in the case of $p^+$-type emitter strips 24. In this way, the starting current density $j_{om}$ can be increased to a particularly high level and thus it can be assured that, although p-type zone 25 injection during the current constriction at turn-off and the electrical field intensity is reduced, the effective current gain factor $\alpha_{pnp}$ remains relatively small even at high current densities and region I' does not remain regenerative and therefore can be switched off easily.

Advisably, the maximum doping concentration $N'_{max}$ of highly doped $n^+$-type partial zone 23a in the central region a in front of the field limiting p-type zone 25 is selected to be between about $3 \times 10^{15}/cm^3$ and about $1 \times 10^{17}/cm^3$. If, for example, a doping concentration $N'_{max} = 5 \times 10^{16}/cm^3$ is selected, the starting current density $j_{om}$ for a width of p-type zone 25 of about 70 μm and other typical dimensions and doping profiles already lies above 3,000 A/cm².

Figure 7:
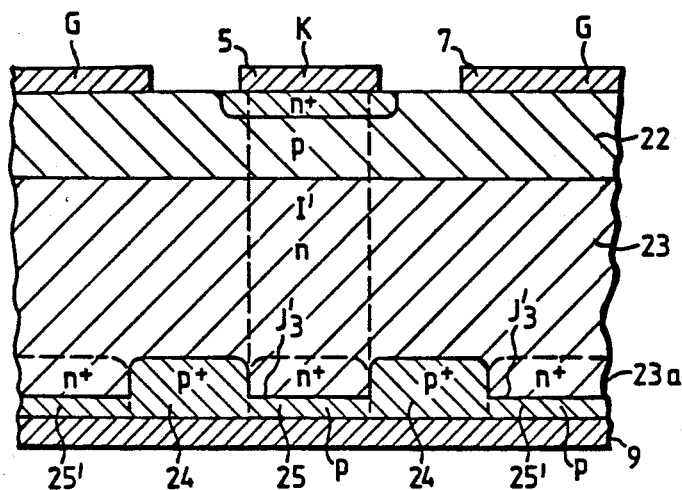
FIG. 7 shows a further embodiment of the unit cell of a gate turn-off thyristor according to the invention.

As shown in FIG. 7, it is also possible to expand the field limiting p-type zone 25 to the p+-type emitter strips 24 so that no anode-side emitter-base short-circuit exists any longer. In this case it is advisable to select the doping concentration $N'_{max}$ of n+-type zone 23a to be higher than in region a in the embodiment of FIG. 6, for example $5 \times 10^{17}/cm^3$. With such a high doping concentration, the current gain factor $\alpha_{pnp}$ in region I' can be set to be easily reproducible even without shorting so that p-type zone 25, on the one hand, injects sufficient holes into the weakly doped n-type base zone 23 during turn-off, but that, on the other hand, region I' above p-type zone 25 is non-regenerative and easily turned off.

As also indicated in FIG. 7, anode-side p-type zones 25' may also be disposed in regions below gate contact 7 and extend in each case to p+-type emitter strips 24. This is favorable from a manufacturing point of view because only one unmasked additional diffusion is required to produce the field limiting p-type zone 25 and p-type zone 25'. Since, in this embodiment, the anode-emitter short-circuits are absent and their function is taken over only in part by the only slightly injecting pn-junctions J'₃, the semiconductor body must additionally be doped with lifetime reducing recombination centers in order to realize good switching properties. With this embodiment without anode-emitter shorting, it is likewise possible to realize an increase in the maximum turn-off current with a high voltage rise rate as compared to prior art GTO thyristors with, as well as without, anode-emitter shorting.

It will be understood that the above description of the present invention is susceptible to various modifications, changes and adaptations, and the same are intended to be comprehended within the meaning and range of equivalents of the appended claims.

What is claimed is:

1. In a gate turn-off thyristor having an npnp structure formed in a semiconductor body and having a cathode side n±-type emitter zone which is divided into a plurality of emitter strips, with each n+-type emitter strip being opposed by a pair of anode-side p±-type emitter strips which are positioned so as to overlap the respective edges of the respective cathode-side emitter strip, and further having a p-type control base zone and an n-type main base zone disposed between said cathode side and anode side emitter strips, with said n-type main base zone having a higher doped n+-type region which extends along the anode side major surface of said semiconductor body and into which said p+-type emitter strips extend from said anode side major surface; the improvement wherein; a single field limiting lower doped p-type zone is disposed between each said pair of anode side p+-type emitter strips positioned opposite a respective said cathode side emitter strip in said n+-type region at said anode side major surface, and forms a zone which is spaced from each of the adjacent pair of said anode side p+-type emitter strips.

2. A thyristor as defined in claim 1 further comprising: a cathode contact for each said cathode side emitter strip; a gate contact for said control base zone disposed adjacent each said cathode side n-type emitter strip; and an anode contact for said anode side p±-type emitter strips, said field limiting p-type zones, and said n+-type region at said anode side major surface.

3. A thyristor as defined in claim 1 wherein: said n+-type region of said main base zone p+-type zone at said anode side major surface; and an anode electrode contacts said p+-type emitter strips, said field limiting p-type zones and said n+-type region at said anode side major surface.

4. A thyristor as defined in claim 3, wherein the width of said field limiting p-type zone is less than that of said p+-type emitter strips.

5. A thyristor as defined in claim 4 wherein the thickness of said p+-type emitter strips and of said field limiting p-type zones is greater than that of said n+-type region of said main base zone.

6. A thyristor as defined in claim 5 wherein the thickness of said field limiting p-type zones is less than that of said p+-type emitter strips.

7. A thyristor as defined in claim 3, wherein the thickness of each said field limiting p-type zone is less than that of said anode-side highly doped n+-type region of said n-type main base zone.

8. A thyristor as defined in claim 7, wherein the maximum doping concentration of said highly doped n+-type region in front of the central region of said field limiting p-type zone is greater than about $3 \times 10^{15}/cm^3$ and less than about $1 \times 10^{17}/cm^3$.

9. A gate-turn off thyristor having an npnp structure formed in a semiconductor body and having a cathode side n+-type emitter zone which is divided into a plurality of emitter strips, which each n+-type emitter strip being opposed by a pair of anode-side p+-type emitter strips which are positioned so as to overlap the respective edges of the respective cathode-side emitter strip, and further having a p-type control base zone and an n-type main base zone disposed between said cathode side and anode side emitter strips, with said n-type main base zone having a higher doped n+-type region which extends along the anode side major surface of said semiconductor body and into which said p+-type emitter strips extend from said anode side major surface, and with each said p+-type emitter strip extending through said n+-type region and forming an a p+n junction with said main n-type base zone; the improvement wherein: a field limiting lower-doped p-type zone is disposed within said n+-type region between each said pair of anode side p+-type emitter strips positioned opposite a respective said cathode side emitter strip, with each said field limiting p-type zone extending along said anode-side major surface to the adjacent said p±-type emitter strips.

10. A thyristor as defined in claim 9, wherein the thickness of said field limiting p-type zone is less than that of said anode-side highly doped n+-type partial zone of said n-type main base zone; and wherein said field limiting p-type zone forms a pn-junction with only said n+-type region of said main base zone.

11. A thyristor as defined in claim 10, wherein the maximum doping concentration of said highly doped n+-type region is equal to or greater than about $5 \times 10^{16}/cm^3$.

12. A thyristor as defined in claim 11 further comprising: a gate electrode for said control base zone disposed on the cathode side major surface of said semiconductor body adjacent each said cathode side n-type emitter strip; a cathode contact for each said cathode side n-type emitter strip disposed on said cathode side major surface; and an anode contact for said anode side p+-type emitter strips and said field limiting p-type zone disposed on said anode side major surface of said semiconductor body.

13. A thyristor as defined in claim 12 wherein, an anode-side p-type zone is disposed in the regions below said gate contact along said anode side major surface.

14. A thyristor as defined in claim 7 wherein the thickness of each said field limiting p-type zone is less than that of said p+-type emitter strips.

15. A thyristor as defined in claim 14 wherein said width of each said field limiting p-type zone is less than that of said p+-type emitter strips.

16. In a gate turn-off thyristor having an npnp structure formed in a semiconductor body and having a cathode side n+-type emitter zone which is divided into a plurality of emitter strips, with each n+-type emitter strip being opposed by a pair of anode-side p-type emitter strips which are positioned so as to overlap the respective edges of the respective cathode-side emitter strip, and further having a p-type control base zone and an n-type main base zone disposed between said cathode side and anode side emitter strips, with said n-type main base zone having a higher doped n+-type region which extends along the anode side major surface of said semiconductor body and into which said p-type emitter strips extend from said anode side major surface; the improvement comprising means, including a single p-type zone disposed between each said pair of anode side p-type emitter strips positioned opposite a respective said cathode side emitter strip and at said anode side major surface, for injecting holes to a lesser degree than the adjacent said pair of anode side p-type emitter strips into said n-type main base zone essentially only during displacement of the space charge zone occurring in the non-regenerative transistor region of the thyristor below the respective said cathode-side emitter strip during turn-off of high currents by the thyristor to dynamically limit the electrical field.

17. A thyristor as defined in claim 16 wherein the doping concentration of each said single p-type zone is less than that of said anode side p-type emitter strips.

18. A thyristor as defined in claim 16, wherein each said single p-type zone is laterally spaced from each of the adjacent pair of said anode side p-type emitter strips.

19. A thyristor as defined in claim 18, wherein the width of said single p-type zones is less than that of said p-type emitter strips.

20. A thyristor as defined in claim 18, wherein the thickness of said single p-type zones is less than that of said higher doped n+-type region.

21. A thyristor as defined in claim 20, wherein the maximum doping concentration of said higher doped n+-type region in front of a central region of each said single p-type zone is greater than approximately $3 \times 10^{15}/cm^3$ and less than approximately $1 \times 10^{17}/cm^3$.

22. A thyristor as defined in claim 16, wherein each said single p-type zone extends along said anode-side major surface to the adjacent said p-type emitter strips.

23. A thyristor as defined in claim 22 wherein: each said single p-type zone has a thickness less than that of said higher doped n+-type region; and the maximum doping concentration of said higher doped n+-type region is equal to or greater than approximately $5 \times 10^{16}/cm^3$.

24. A thyristor as defined in claim 22, wherein each said single p-type zone has a doping concentration and a thickness less than that of said anode side p-type emitter strips; and further comprising: a gate electrode for said control base zone disposed on the cathode side major surface of said semiconductor body adjacent each said cathode side n-type emitter strip; a cathode contact for each said cathode side n-type emitter strip disposed on said cathode side major surface; an anode contact for said anode side p-type emitter strips and said single p-type zones disposed on said anode side major surface of said semiconductor body; and further anode side p-type zones disposed in the regions below said gate contact and extending from said anode side p-type emitter strips along said anode side major surface of said semiconductor body.

* * * * *